United States Patent
Park et al.

(10) Patent No.: US 9,741,584 B1
(45) Date of Patent: Aug. 22, 2017

(54) DENSIFICATION OF DIELECTRIC FILM USING INDUCTIVELY COUPLED HIGH DENSITY PLASMA

(71) Applicant: Lam Research Corporation, Fremont, CA (US)

(72) Inventors: Jason Daejin Park, Lake Oswego, OR (US); Bart van Schravendijk, Sunnyvale, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 6 days.

(21) Appl. No.: 15/147,368

(22) Filed: May 5, 2016

(51) Int. Cl.
*H01L 21/31* (2006.01)
*H01L 21/3105* (2006.01)
*H01L 21/762* (2006.01)

(52) U.S. Cl.
CPC .. *H01L 21/31051* (2013.01); *H01L 21/76224* (2013.01)

(58) Field of Classification Search
CPC ................................................ H01L 21/31051
See application file for complete search history.

(56) References Cited

U.S. PATENT DOCUMENTS

| | | | | |
|---|---|---|---|---|
| 5,939,831 A * | 8/1999 | Fong | ................... | C23C 16/4405 134/1.1 |
| 6,136,685 A * | 10/2000 | Narwankar | ........... | C23C 16/401 257/E21.276 |
| 7,148,155 B1 * | 12/2006 | Tarafdar | ............ | H01L 21/02164 257/E21.279 |
| 7,297,608 B1 * | 11/2007 | Papasouliotis | .... | H01L 21/76224 257/E21.54 |
| 7,709,345 B2 * | 5/2010 | Sandhu | ............. | H01L 21/76237 257/E21.545 |
| 8,685,867 B1 * | 4/2014 | Danek | ............... | H01L 21/76801 257/E21.001 |
| 8,846,536 B2 * | 9/2014 | Draeger | ............ | H01L 21/02126 216/87 |
| 2001/0019903 A1 * | 9/2001 | Shufflebotham | ...... | C23C 16/402 438/788 |
| 2004/0137757 A1 * | 7/2004 | Li | ........................... | C23C 16/30 438/778 |
| 2004/0219789 A1 * | 11/2004 | Wood | .................... | C23C 14/022 438/690 |
| 2007/0289534 A1 * | 12/2007 | Lubomirsky | ......... | C23C 16/452 118/723 R |
| 2013/0065404 A1 * | 3/2013 | Weidman | .............. | C23C 16/325 438/786 |
| 2015/0024604 A1 * | 1/2015 | Ogata | ................. | H01L 21/3065 438/712 |

* cited by examiner

*Primary Examiner* — Evren Seven
*Assistant Examiner* — S. M. S Imtiaz

(57) ABSTRACT

A method for densifying a dielectric film on a substrate includes arranging a substrate including a dielectric film on a substrate support in a substrate processing chamber; supplying a gas mixture including helium and oxygen to the substrate processing chamber; controlling pressure in the substrate processing chamber to a pressure greater than or equal to a predetermined pressure; supplying a first power level at a first frequency to a coil to create plasma in the substrate processing chamber. The coil is arranged around an outer surface of the substrate processing chamber. The method includes densifying the dielectric film for a predetermined period. The pressure and the first power level are selected to prevent sputtering of the dielectric film during densification of the dielectric film.

17 Claims, 5 Drawing Sheets

DENSIFICATION OF DIELECTRIC FILM USING INDUCTIVELY COUPLED HIGH DENSITY PLASMA

FIELD

The present disclosure relates to substrate processing systems, and more particularly to densification of dielectric film using a high density, inductively coupled plasma source.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to deposit and etch film on a substrate such as a semiconductor wafer. The substrate processing systems typically include a processing chamber, a gas distribution device and a substrate support. During processing, the substrate is arranged on the substrate support. Different gas mixtures may be introduced into the processing chamber and radio frequency (RF) plasma may be used to activate chemical reactions.

Shallow trench isolation (STI) features provide electrical isolation between individual transistor devices in integrated circuits (ICs). The STI features may be filled with dielectric film such as flowable oxide that is deposited using flowable chemical vapor deposition (FCVD) or other methods. The flowable oxide provides liquid-like filling behavior.

The quality of the flowable oxide film is limited by high silanol content, which makes the flowable oxide film porous. The silanol bonds in the flowable oxide film are removed by annealing in a high temperature furnace, exposure to UV treatment or plasma annealing. The effectiveness of each of these approaches is limited due to low thermal budgets and poor penetration depth into the flowable oxide film. Conventional plasma annealing cannot be used due to a high sputtering rate, which damages the film.

In some applications, an aspect ratio (AR) of the trench can be as high as 8:1 and an opening of the trench may narrow down to about 20 nm. Achieving void-free STI fill is important because the film may be subjected to further processing during subsequent integration steps. The subsequent processing may expose the voids. In some examples, the voids may be unintentionally filled with conductive material, which can lead to short circuits.

The densification process should be able to achieve a fully densified film down to a bottom portion of the trenches or to a point where wet chemicals may reach during subsequent chemical mechanical polishing (CMP) or other wet integration steps.

SUMMARY

A method for densifying a dielectric film on a substrate includes arranging a substrate including a dielectric film on a substrate support in a substrate processing chamber; supplying a gas mixture including helium and oxygen to the substrate processing chamber; controlling pressure in the substrate processing chamber to a pressure greater than or equal to a predetermined pressure; and supplying a first power level at a first frequency to a coil to create plasma in the substrate processing chamber. The coil is arranged around at least part of an outer surface of the substrate processing chamber. The method further includes densifying the dielectric film for a predetermined period. The pressure and the first power level are selected to prevent sputtering of the dielectric film during densification of the dielectric film.

In other features, the method includes supplying a second power level at a second frequency to the coil while supplying the first power level at the first frequency.

The method includes supplying a third power level to the substrate support at a third frequency while supplying the first power level at the first frequency and the second power level at the second frequency. The predetermined pressure, the first power level, the second power level and the third power level are selected to prevent sputtering of the dielectric film during densification of the dielectric film.

In other features, the predetermined pressure is greater than or equal to 40 mTorr. The first power level is greater than or equal to 5000 W and the first frequency is in a range from 340 kHz to 375 kHz. The third power level is less than or equal to 2000 W and the third frequency is 13.56 MHz. The second frequency is in a range from 420 kHz to 460 KHz.

In other features, the first power level is greater than 5000 W, the third power level is less than or equal to 2000 W and the predetermined pressure is greater than or equal to 40 mTorr.

In other features, the first power level is between 6000 W and 8000 W, the second power level is between 3000 W and 5000 W and the third power level is less than 2000 W. A temperature of the substrate is less than 570° C. during densification of the dielectric film. The dielectric film includes a flowable oxide film.

A method for densifying a dielectric film on a substrate includes arranging a substrate including a dielectric film on a substrate support in a substrate processing chamber; supplying a gas mixture including helium and oxygen to the substrate processing chamber; controlling pressure in the substrate processing chamber to a pressure greater than or equal 40 mTorr; and supplying a first power level at a first frequency and a second power level at a second frequency to a coil to create plasma in the substrate processing chamber. The coil is arranged around an outer surface of the substrate processing chamber. The method further includes supplying a third power level to the substrate support at a third frequency; and densifying the dielectric film for a predetermined period. The first power level is greater than or equal to 5000 W, the second power level is between 3000 W and 5000 W and the third power level is less than or equal to 2000 W.

In other features, the first frequency is in a range from 340 kHz to 375 kHz, the second frequency is in a range is from 420 kHz to 460 KHz and the third frequency is 13.56 MHz. The first power level is between 6000 W and 8000 W. A temperature of the substrate is less than 570° C. during densification of the dielectric film. The dielectric film includes a flowable oxide film.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The present disclosure relates to systems and methods for densifying dielectric film such as flowable oxide film that is deposited in features. In some examples, the features include shallow trench isolation (STI). Plasma source conditions during plasma annealing in an inductively coupled plasma (ICP) chamber are modified to provide high plasma source power, which minimizes plasma voltage and a sputter rate. In some examples, a high chamber pressure is used to reduce a mean free path and ion energy. The use of high plasma power and high pressure allows film densification to occur without sputtering.

In some examples, RF bias power is supplied to the substrate support to enhance a penetration depth into the dielectric film. The RF bias power may be supplied at the same frequency as the coil power or at a different frequency. During densification as described herein, a temperature of the substrate can be maintained less than 570° C., which is lower than conventional thermal annealing (at approximately 900° C.). In some examples, a plasma gas mixture including helium and oxygen is used to accelerate silanol removal from the film and improve the penetration depth as compared to non-oxidizing plasma gas mixtures.

The substrate processing system described herein employs "soft" plasma by reducing a difference between the plasma voltage ($V_p$) and the substrate voltage ($V_w$). Energy supplied to the substrate is equal to $q*N_i*(V_p-V_w)$, where $N_i$ is the ion density, $V_p$ is the plasma voltage, q is a calibration factor that is set based on chamber design, power efficiency and other factors, and $V_w$ is the wafer voltage. If ($V_p-V_w$) is higher than a sputter threshold (approximately 20 V), sputtering occurs. High ion flux (increasing $N_i$) reduces ($V_p-V_w$) and creates "soft" plasma.

Figure 1:
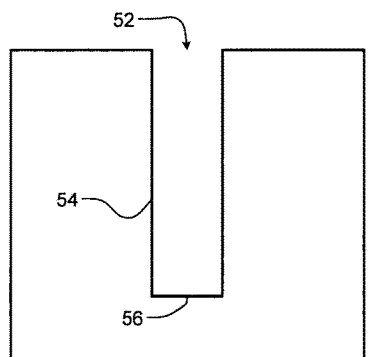
FIG. 1 is a side cross-sectional view of an example of a substrate including a shallow trench isolation feature according to the present disclosure.
Figure 2:
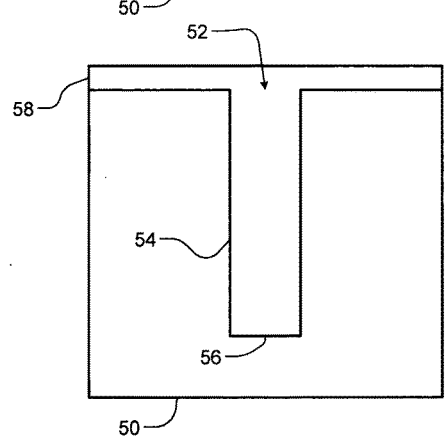
FIG. 2 is a side cross-sectional view of an example of the substrate of FIG. 1 after the feature is filled using a flowable oxide film according to the present disclosure.
Figure 3:
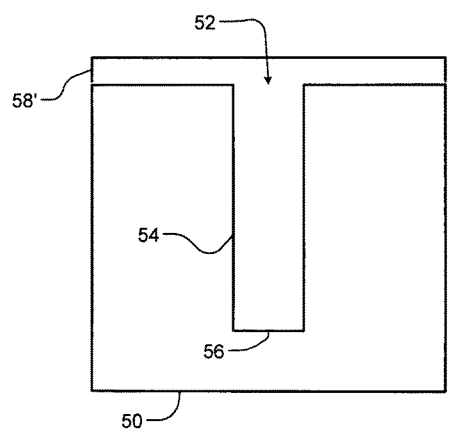
FIG. 3 is a side cross-sectional view of an example of the substrate of FIG. 2 after a densification method is performed according to the present disclosure.

Referring now to FIGS. 1-3, an STI feature is filled with dielectric film and the dielectric film is densified. In FIG. 1, a substrate 50 includes an STI feature 52 having sidewalls 54 and a bottom 56. In FIG. 2, a dielectric film 58 such as a flowable oxide film is deposited in the STI feature 52. In FIG. 3, the dielectric film is subjected to a densification process to create densified dielectric film 58'.

Figure 4:
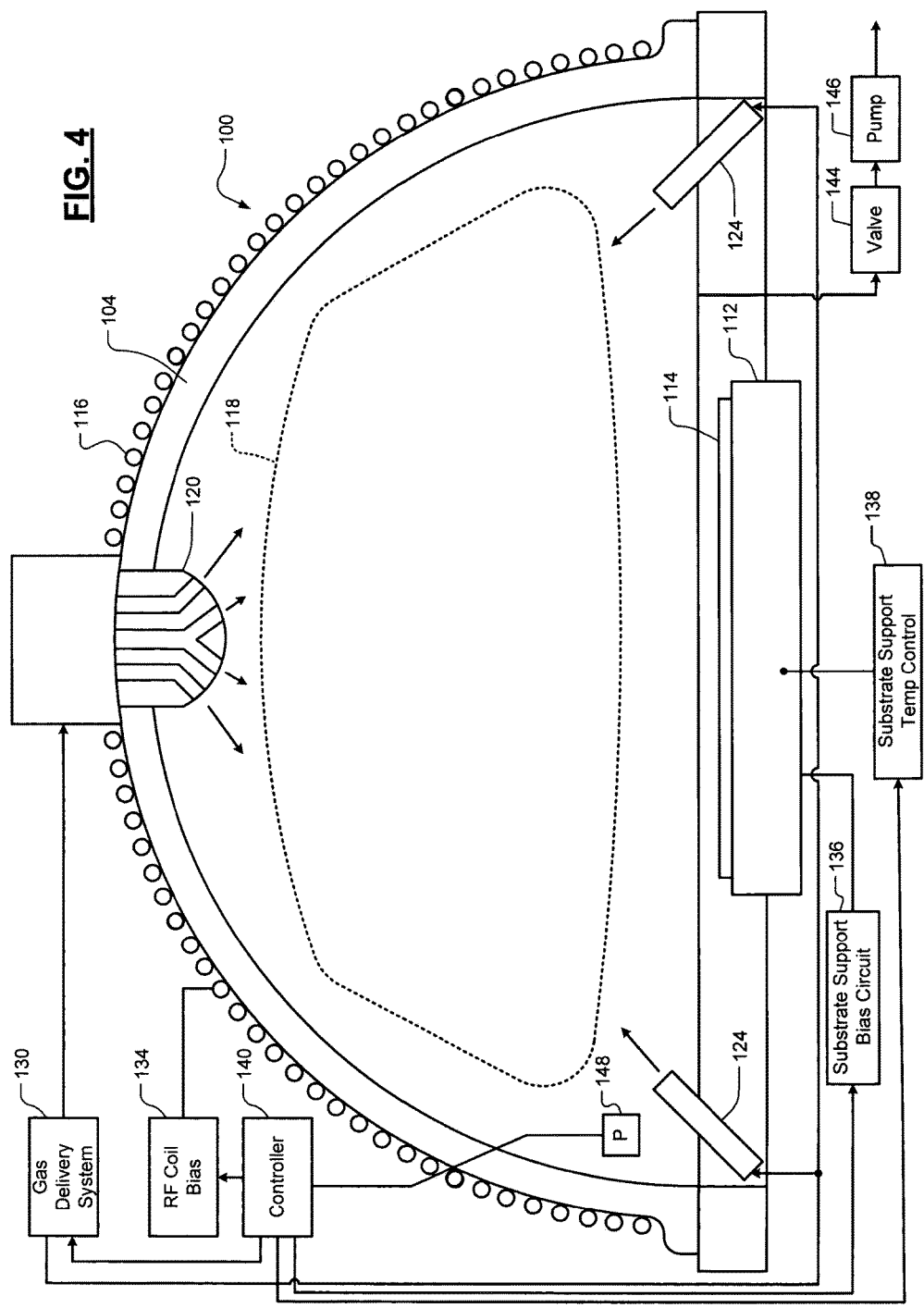
FIG. 4 is a functional block diagram of an example of a substrate processing chamber for performing densification of the flowable oxide film according to the present disclosure.

Referring now to FIG. 4, a substrate processing chamber 100 may be used to perform densification as described above and below. While a specific chamber is shown, other inductively coupled plasma (ICP) chambers may be used. The substrate processing chamber 100 includes a semi-spherical dome 104 and a substrate support 112 for supporting a substrate 114. While a semi-spherical dome 104 is shown, the substrate processing chamber 100 may have other shapes including elliptical, flat-topped, etc. In some examples, the substrate support 112 includes an electrostatic chuck (ESC) although other substrate supports may be used.

A coil 116 is arranged around an outer surface of the semi-spherical dome 104. One or more upper gas injectors 120 are arranged in an upper portion of the semi-spherical dome 104 to inject a process gas mixture in a downward and/or outward direction. One or more lower gas injectors 124 are arranged in a lower portion of the semi-spherical dome 104 to inject the process gas mixture in an upward and/or inward direction relative to the semi-spherical dome 104 and the substrate 114. For example only, the lower gas injectors 124 may include 36 gas injectors that are uniformly spaced around a lower periphery of the semi-spherical dome 104.

A gas delivery system 130 supplies a process gas mixture to the upper gas injectors 120 and the lower gas injectors 124. The gas delivery system 130 may include one or more gas sources, mass flow controllers, valves and/or manifolds (not shown). An RF bias circuit 134 supplies RF power to the coil 116 to create plasma 118 within the semi-spherical dome 104. A substrate support bias circuit 136 supplies RF power to the substrate support 112. A substrate support temperature control circuit 138 controls a temperature of the substrate support 112 during substrate processing. The substrate temperature control circuit 138 may include systems for delivering heating and/or cooling fluid to flow channels in the substrate support 112, resistive heaters, and/or other devices for controlling the temperature of the substrate support 112.

A valve 144 and a pump 146 are provided to evacuate reactants from the processing chamber. In some examples, the pump 146 includes a variable speed pump In some examples, the pump 146 includes a turbo pump. A speed of the pump 146 is varied to set a pressure inside of the substrate processing chamber 100. Open loop or closed loop feedback may be used to control pressure inside of the substrate processing chamber 100.

If closed loop feedback is used, a pressure sensor 148 may be used to measure pressure inside of the substrate processing chamber 100. The controller 140 may communicate with the variable speed pump 146 to control pressure inside of the substrate processing chamber 100 based on the measured pressure. If open loop feedback is used, the speed of the pump 146 is used to control the pressure inside of the substrate processing chamber 100. Lower pump speeds correspond to higher pressures while higher pump speeds correspond to lower pressures. In addition, the controller 140 may be used to control timing and delivery of the process gas mixture from the gas delivery system 130 and power to the coil 116 and the substrate support 112.

While specific examples of operating parameters and gas mixtures are described below, other operating parameters and gas mixtures may be used. In some examples, the plasma gas mixture includes helium (He) and oxygen (O). In some examples, the oxygen may be supplied using molecular oxygen ($O_2$), carbon dioxide ($CO_2$), nitrous oxide ($N_2O$), nitric oxide (NO), ozone ($O_3$), water (steam) ($H_2O$), hydrogen peroxide ($H_2O_2$) or other suitable oxygen containing gases.

For examples, when $H_2$ and $O_2$ gases are used, He and $O_2$ produce VUV at different wavelengths. VUV emission of He is ~58 nm and $O_2$ is ~130 nm. Other process gases may include Ar at ~105 nm and ~107 nm, molecular nitrogen ($N_2$) at ~120 nm, and molecular hydrogen ($H_2$) at ~121 nm. A relatively low substrate support bias avoids film damage due to sputtering.

In some examples, He is supplied at 720 sccm and $O_2$ is supplied at 500 sccm. The pedestal is arranged about 1.2" from an injection location of the lower gas injectors 124 (which roughly corresponds to a lower location of the plasma). The coil 116 is excited by RF power.

In some examples, the RF power is supplied to the coil 116 at a single frequency in a range between 340-460 Hz and at a power level greater than 10 kW. In some examples, the RF power may be supplied to the coil 116 at two or more different frequencies. For example, a low frequency (LF) and a medium frequency (MF) may be used. In some examples, the substrate support is biased by RF power at a high frequency (HF). In some examples, the LF power has a frequency in a range from 340 to 375 kHz and the MF power has a frequency from 420 to 460 kHz, although other frequencies can be used. In some examples, the HF power has a frequency of 13.56 MHz, although other frequencies can be used.

In a first example, the pressure in the chamber is maintained at 50 mTorr, the LF power is 7000 W, the MF power is 4000 W, the HF power is 0 W and the process period is 300 seconds, although other power levels, pressures and periods can be used. The substrate temperature is approximately 520° C. during densification.

In a second example, the pressure in the chamber is maintained at 50 mTorr, the LF power is 7000 W, the MF power is 4000 W, the HF power is 2000 W and the process period is 600 seconds, although other power levels, pressures and periods can be used. The substrate temperature is approximately 536° C. during densification.

In other examples, the LF power is greater than or equal to 5000 W, the HF power is less than or equal to 2000 W and the chamber pressure is greater than or equal to 40 mTorr. In other examples, the LF power is in a range between 6000 W and 8000 W, the MF power level is in a range between 3000 W and 5000 W and the HF power level is less than or equal to 2000 W.

Figure 5:
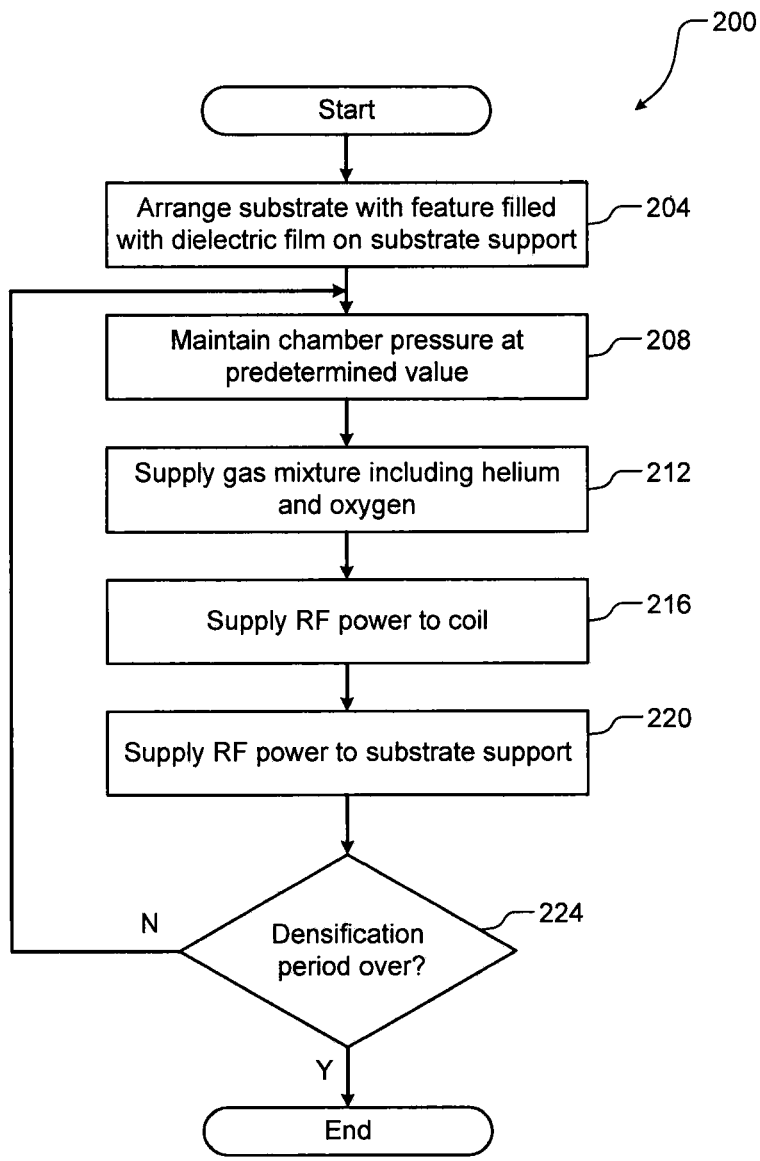
FIG. 5 is a flowchart illustrating an example of a method for identifying the flowable oxide film according to the present disclosure.

Referring now to FIG. 5, a method 200 for densifying dielectric film in an STI feature is shown. At 204, a substrate is arranged in a processing chamber. The substrate includes a feature that is filled with a dielectric film such as flowable oxide film. At 208, chamber pressure is maintained at a predetermined value that is greater than or equal to 40 mTorr. At 212, a gas mixture is supplied to the processing chamber. The gas mixture includes oxygen and helium (He). At 216, power (including LF and MF power) is supplied to the coil. At 220, HF power is supplied to the substrate support. At 224, control determines whether a densification period is over. If 224 is false, the method returns to 208. Otherwise, the method ends.

Figures 6, 7:
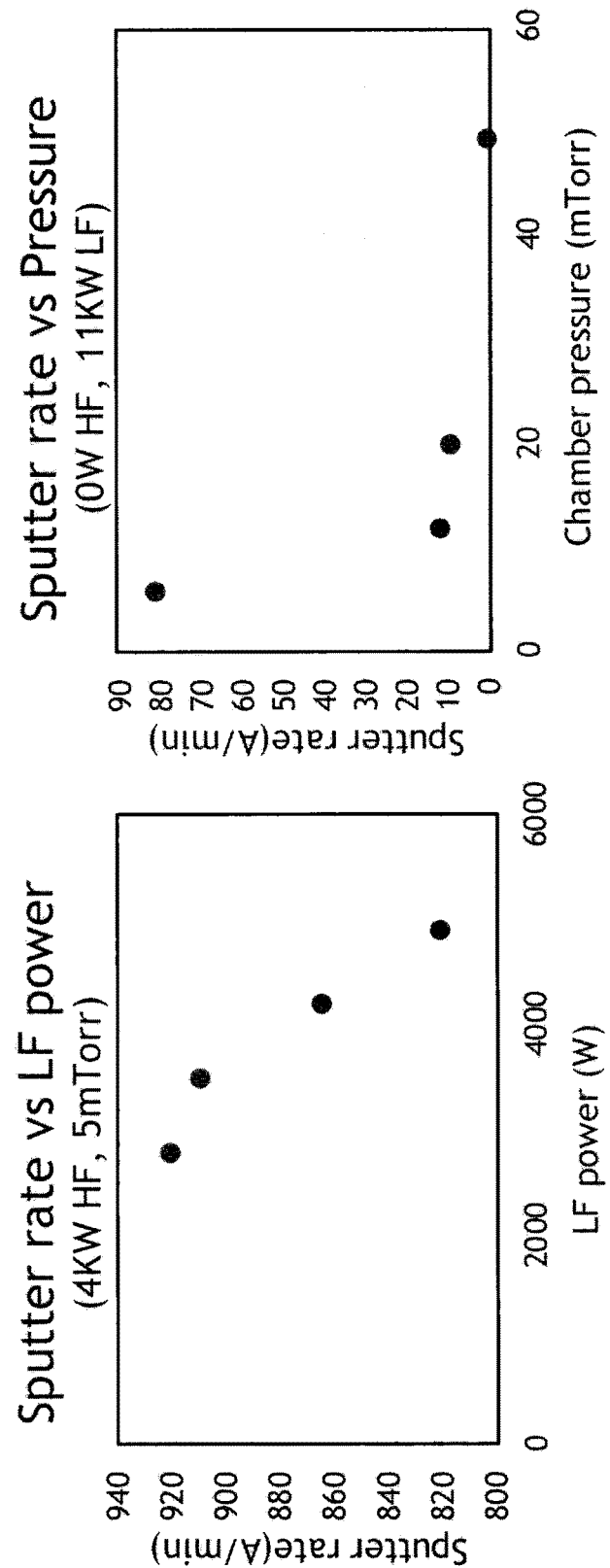
FIG. 6 is a graph of an example of sputter rate as a function of low-frequency power supplied to the coil.
FIG. 7 is a graph illustrating an example of sputter rate as a function of pressure.
Figure 8:
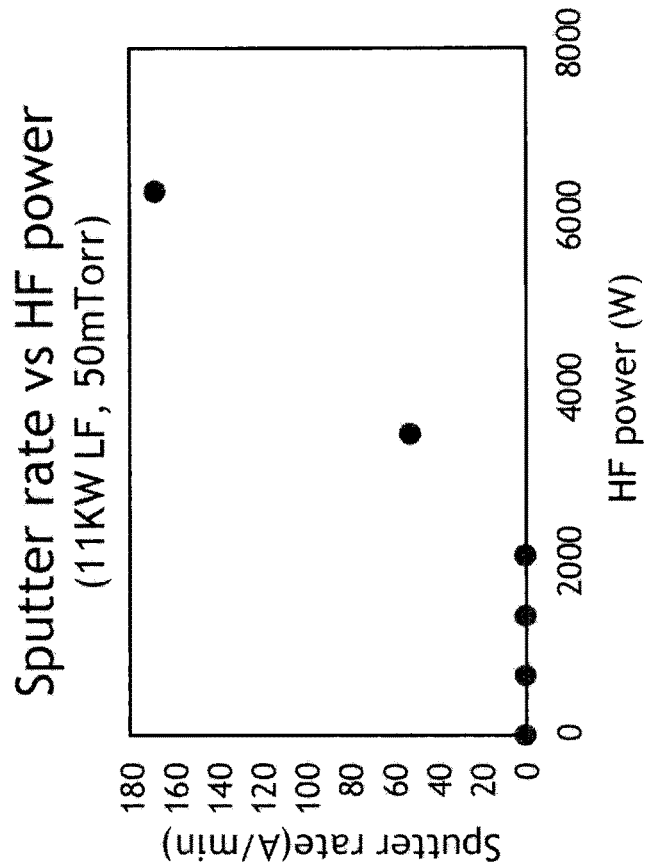
FIG. 8 is a graph illustrating an example of sputter rate as a function of a high frequency power supplied to the substrate support.

Referring now to FIGS. 6-9, the sputter rate is shown as a function of various input parameters such as LF power, chamber pressure and HF power. In FIG. 6, the sputter rate is shown as a function of LF power while maintaining HF power at 4 kW and chamber pressure at 5 mTorr. As can be seen, the sputter rate drops off significantly at around 5000 W of LF power. In FIG. 7, the sputter rate is shown as a function of chamber pressure while maintaining HF power at 0 W and LF power at 11 kW. As can be seen, the sputter rate drops off significantly at pressures greater than around 40 mTorr. In FIG. 8, the sputter rate is shown as a function of HF power. As can be seen, the sputter rate starts to increase at HF power levels above 2000 W.

Figure 9:
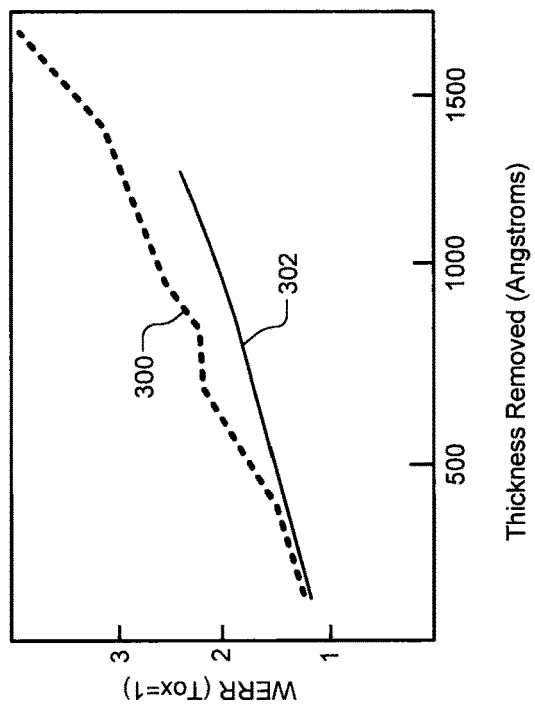
FIG. 9 illustrates an example of wet etch rate ratio (WERR) as a function of etch thickness.

Referring now to FIG. 9, a wet etch rate ratio (WERR) that is less than 3 can be achieved using the first example parameters described above (no substrate support bias) for thicknesses less than or equal to 1500 Å. A WERR that is less than 2 can be achieved using the second example parameters described above for thicknesses of 1000 Å.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for densifying a dielectric film on a substrate, comprising:
   arranging a substrate including a dielectric film on a substrate support in a substrate processing chamber;
   supplying a gas mixture including helium and oxygen to the substrate processing chamber;
   controlling pressure in the substrate processing chamber to a pressure greater than or equal to a predetermined pressure;
   supplying a first power level at a first frequency to a coil to create plasma in the substrate processing chamber, wherein the coil is arranged around at least part of an outer surface of the substrate processing chamber;
   supplying a second power level at a second frequency to the coil while supplying the first power level at the first frequency; and
   densifying the dielectric film for a predetermined period, wherein the pressure and the first power level are selected to prevent sputtering of the dielectric film during densification of the dielectric film.

2. The method of claim 1, further comprising supplying a third power level to the substrate support at a third frequency while supplying the first power level at the first frequency and the second power level at the second frequency.

3. The method of claim 2, wherein the predetermined pressure, the first power level, the second power level and the third power level are selected to prevent sputtering of the dielectric film during densification of the dielectric film.

4. The method of claim 1, wherein the predetermined pressure is greater than or equal to 40 mTorr.

5. The method of claim 1, wherein the first power level is greater than or equal to 5000 W and the first frequency is in a range from 340 kHz to 375 kHz.

6. The method of claim 3, wherein the third power level is less than or equal to 2000 W and the third frequency is 13.56 MHz.

7. The method of claim 1, wherein the second frequency is in a range from 420 kHz to 460 KHz.

8. The method of claim 2, wherein the first power level is greater than 5000 W, the third power level is less than or equal to 2000 W and the predetermined pressure is greater than or equal to 40 mTorr.

9. The method of claim 2, wherein the first power level is between 6000 W and 8000 W, the second power level is between 3000 W and 5000 W and the third power level is less than 2000 W.

10. The method of claim 1, wherein a temperature of the substrate is less than 570° C. during densification of the dielectric film.

11. The method of claim 1, wherein the dielectric film includes a flowable oxide film.

12. A method for densifying a dielectric film on a substrate, comprising:
    arranging a substrate including a dielectric film on a substrate support in a substrate processing chamber;

supplying a gas mixture including helium and oxygen to the substrate processing chamber;

controlling pressure in the substrate processing chamber to a pressure greater than or equal 40 mTorr;

supplying a first power level at a first frequency and a second power level at a second frequency to a coil to create plasma in the substrate processing chamber, wherein the coil is arranged around an outer surface of the substrate processing chamber;

supplying a third power level to the substrate support at a third frequency; and densifying the dielectric film for a predetermined period, wherein the first power level is greater than or equal to 5000 W, the second power level is between 3000 W and 5000 W and the third power level is less than or equal to 2000 W.

13. The method of claim 12, wherein the first frequency is in a range from 340 kHz to 375 kHz, the second frequency is in a range is from 420 kHz to 460 KHz and the third frequency is 13.56 MHz.

14. The method of claim 12, wherein the first power level is between 6000 W and 8000 W.

15. The method of claim 12, wherein a temperature of the substrate is less than 570 ° C. during densification of the dielectric film.

16. The method of claim 12, wherein the dielectric film includes a flowable oxide film.

17. A method for densifying a dielectric film on a substrate, comprising:

arranging a substrate including a dielectric film on a substrate support in a substrate processing chamber;

supplying a gas mixture including helium and oxygen to the substrate processing chamber;

controlling pressure in the substrate processing chamber to a pressure greater than or equal to a predetermined pressure;

supplying a first power level at a first frequency and a second power level at a second frequency to a coil to create plasma in the substrate processing chamber, wherein the coil is arranged around at least part of an outer surface of the substrate processing chamber, wherein the first power level is in a first range and the second power level is in a second range, and wherein the first range and the second range are non-overlapping; and densifying the dielectric film for a predetermined period, wherein the pressure and the first and second power levels are selected to prevent sputtering of the dielectric film during densification of the dielectric film.

* * * * *